US005774795A

United States Patent [19]

Ando

[11] Patent Number: 5,774,795

[45] Date of Patent: Jun. 30, 1998

[54] MOBILE OBJECT IDENTIFICATION DEVICE

[75] Inventor: Toshihide Ando, Chita-gun, Japan

[73] Assignee: Nippondenso Co., Ltd., Kariya, Japan

[21] Appl. No.: 503,091

[22] Filed: Jul. 17, 1995

[30] Foreign Application Priority Data

Jul. 20, 1994 [JP] Japan .................................... 6-168257

[51] Int. Cl.[6] ................................ H03C 1/52; H04B 1/02

[52] U.S. Cl. .......................... 455/106; 455/517; 455/522; 455/562

[58] Field of Search ................................. 455/56.1, 54.1, 455/54.2, 61, 106, 62, 63, 68, 127, 59, 502, 510, 517, 522, 524, 562; 340/928; 342/42, 44, 51

[56] References Cited

U.S. PATENT DOCUMENTS

| | | | |
|---|---|---|---|
| 4,303,904 | 12/1981 | Chasek | 235/384 |
| 5,056,109 | 10/1991 | Gilhousen et al. | 455/33.1 |
| 5,086,389 | 2/1992 | Hassett et al. | 705/13 |
| 5,144,553 | 9/1992 | Hassett et al. | 705/13 |
| 5,390,338 | 2/1995 | Bodin et al. | 455/69 |

FOREIGN PATENT DOCUMENTS

| | | |
|---|---|---|
| 161779 | 11/1985 | European Pat. Off. . |
| 0401192 | 12/1990 | European Pat. Off. . |
| 0585718 | 3/1994 | European Pat. Off. . |
| 590590 | 4/1994 | European Pat. Off. . |
| 0609453 | 8/1994 | European Pat. Off. . |
| 50-247334 | 12/1985 | Japan . |
| 60-247334 | 12/1985 | Japan . |
| 293390 | 4/1990 | Japan . |
| 2171677 | 7/1990 | Japan . |

*Primary Examiner*—Edward F. Urban
*Assistant Examiner*—Gertrude Arthur
*Attorney, Agent, or Firm*—Cushman Darby & Cushman IP Group of Pillsbury Madison & Sutro LLP

[57] ABSTRACT

A communication area for an antenna disposed on a toll collection gate and a communication area for a responder unit (IU) mounted on an automobile are arranged to coincide with each other. Communication failure in overlapping areas where a plurality of communication areas are formed in a toll collection area is prevented. When an IU receives a pilot signal-wave, a carrier-radio-wave-signal is subsequently transmitted thereto. The IU modulates the carrier-radio-wave-signal with a responding data-signal and transmits the modulated-carrier-radio-wave as a responding signal-wave. In this system, the output power of the responding signal-wave is attenuated during the round trip of the carrier-radio-wave. Therefore, the output power thereof is decreased from an original level when the pilot signal-wave is transmitted. On the other hand, when other signal waves are transmitted, their output power are restored to the original level, thereby equalizing the power of the responding signal of the IU and that of the communication signals from the antenna. Thus, steady communication is ensured.

48 Claims, 10 Drawing Sheets

FIG. 4
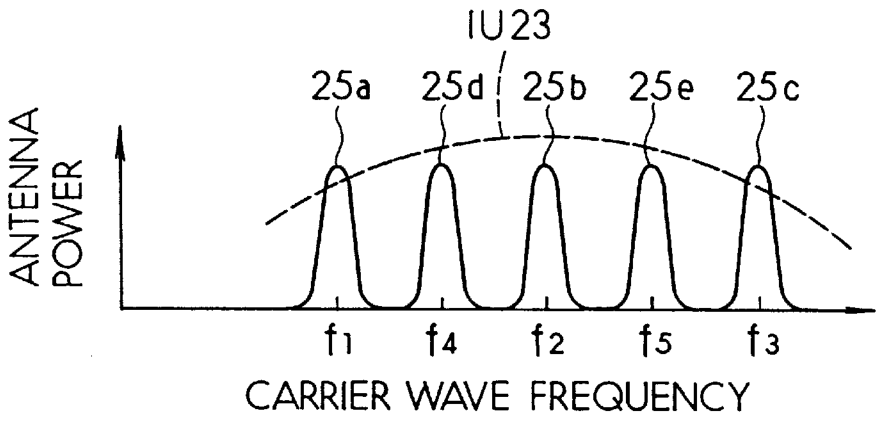
FIG. 5A
FIG. 5B
FIG. 5C
FIG. 5D
FIG. 5E
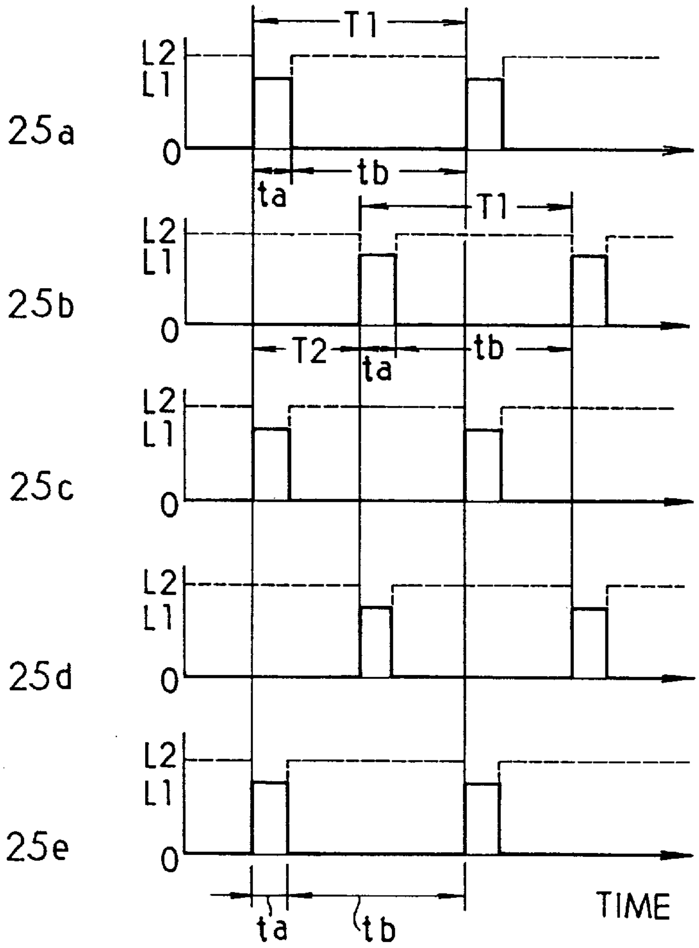

25a
25b
23a
23b
L2
L1
0
Sp
Sk
CARRIER WAVE
Ap
Ak
RUNNING IN 26a
RUNNING IN 26b
TIME

25a

23c

23d

23e
L2
L1
0
Sp
Sk
CARRIER WAVE
START
COMPLETE
RUNNING IN 26a
START
COMPLETE
RUNNING IN 26a
RUNNING IN 26ad
TIME

MOBILE OBJECT IDENTIFICATION DEVICE

CROSS REFERENCE TO RELATED APPLICATION

The present application is based on and claims priority from Japanese Patent Application No. Hei 6-168257 filed on Jul. 20, 1994, the contents of which are incorporated herein by reference.

BACKGROUND OF THE INVENTION

1. Field of the Invention

The present invention relates to a mobile object identification device having an antenna located at a station and a responder unit which is mounted on a mobile object. In particular, it relates to a device in which an interrogatory signal-wave is transmitted from the antenna to the responder unit of a mobile object in a communication area to identify the object according to a responding signal transmitted from the responder.

2. Description of the Related Art

A toll collection system for a toll road is one of the well known mobile object identification systems. The toll collection system, as shown in FIG. 11, has an in-vehicle responder unit 3 ( hereinafter referred to as IU) disposed on the windshield glass of an automobile 2 and an antenna 4 disposed on a toll gate. The toll gate is located at a predetermined station to communicate with an IU 3.

A pilot signal-wave of a given frequency is transmitted repeatedly by a control unit (not shown) from the antenna 4 to a communication area Sd. In response to the pilot signal wave, the control unit when it receives a responding signal transmitted by the IU 3 of the automobile 2. When it passes through the communication area Sd, the control unit transmits interrogatory signal waves such as a read-command signal, a write-command signal and the like for the toll-collection, and receives the responding signals corresponding thereto.

The IU 3 does not generate a radio wave signal by itself. The antenna 4 transmits the pilot signal-wave or the interrogatory signal-wave, and subsequently an unmodulated-carrier radio-wave. The IU 3 receives the carrier radio-wave and modulates it with a responding signal and responds to the antenna 4 by reflection of the carrier radio-wave. In other words, the IU 3 is not required to have an oscillating circuit or an electric power source. This results in a simple, compact and inexpensive IU 3, as well as power savings for the automobile.

At the side of the antenna 4 which receives the responding signal, toll-due amount and/or the current balance thereof are calculated according to the type of the automobile and toll collection data. Thus, the driver is not required to stop his automobile 2 for exchanging a card or money each time he uses the toll road. Therefore, congestion at the toll gate is relieved, and the troublesome exchange of the card or money can be omitted. In addition, people working in the toll gate may avoid exposure to the exhaust gases of automobiles.

However, in the above system, an unmodulated carrier-radio-wave-signal transmitted from the antenna 4 is reflected toward the antenna 4 after it is modulated with a responding signal. Thus, it becomes attenuated before it is received by the antenna 4. Therefore, the responding-communication area Su (uplink area), where the responding signal-wave-signal transmitted by the IU 3 can be received by the antenna 4 becomes narrower than the communication area Sd (downlink) where the pilot signal-wave and the interrogatory signal-wave transmitted by the antenna 4 can be received by the IU3.

The IU 3 of the automobile 2 in the responding-communication area Su shown in FIG. 11 can transmit the responding signal-wave to the antenna 4 in response to the pilot signal-wave. However, an IU 3*d* of another automobile in the communication area Sd (indicated by a broken line) is out of the responding-communication area Su and cannot transmit the responding signal-wave to the antenna 4 in response to the pilot signal-wave. Therefore, the substantial communication area is the communication area Su, which is also the uplink area.

As shown in FIG. 12, if a plurality of antennas 6 and 7 are used to cover a broader communication area, the following problems arise.

The antennas 6 and 7 are set side by side and the uplink areas are formed as the communication areas Su1 and Su2 as shown in FIG. 12. The communication areas are arranged to form an overlapping area Sup at an adjacent portion thereof. Thus, communication failure with the automobile passing through the portion between the communication areas Su1 and Su2 is avoided.

The antennas 6 and 7 are arranged to output the radio wave signals of different frequencies at different timings. Thus, the communication with the antenna 6, for instance, is ensured even if an automobile passes through the intervening portion between the areas Su1 and Su2. The antenna 6 receives the pilot signal-wave first, since the IU 3 composes the responding signal and modulates the unmodulated carrier radio-wave received from the antenna 6 and the antenna 7 does not respond to the pilot signal-wave.

However, in order to provide the communication areas Su1 and Su2 in which the responding signal of the IU 3 can be transmitted, the broader downlink areas Sd1 and Sd2 must be formed (as indicated by broken lines in FIG. 12). Therefore, in some situations two automobiles 2*b* and 2*c*, as shown in FIG. 12, are in the communication area Su 1, and the IU 3*c* of the automobile 2*c* is out of the area Su 2 but within the downlink area Sd 2. In these situations, if the antenna 7 receives the pilot signal-wave first, the responding signal-wave of the automobile 2*c* is not received by the antenna 7, but rather by the antenna 6. However, since the other automobile 2*b* also is in the communication area Su 1, the IU 3*b* transmits a responding signal-wave in response to the pilot signal-wave coming from the antenna 6. This responding signal wave interferes with the responding signal-wave of the IU 3*c*, causing communication troubles.

SUMMARY OF THE INVENTION

The present invention is made in view of the above mentioned circumstances. The main object of the present invention provides a mobile object identification device in which a communication area formed by an antenna disposed on a station and another communication area formed by a responder unit (or In Vehicle Unit, hereinafter referred to as the IU) mounted on an mobile object become substantially the same in their shapes and sizes, thereby preventing communication failure.

Another object of the present invention is to provide a mobile object identification device which includes the IU mounted on a mobile object for modulating a carrier radio-wave received from the outside with related data and transmitting it back as a responding signal-wave. An antenna control means transmits a carrier radio-wave and receives the responding signal-wave through an antenna to identify the automobile. The output power of the antenna is decreased to a prescribed level during the communication so that the transmitting area (or downlink area) and the receiving area (uplink area) of the antenna and IU may coincide with each other during the communication.

A further object of the present invention is to provide a mobile object identification device which includes an IU mounted on an automobile for modulating a carrier radio-wave received from the outside with related data. The IU transmits the carrier radiowave back as a call-back signal-wave when it receives a call signal-wave from the outside. The IU modulates another carrier radio-wave with answering data and transmits it back as an answering signal-wave when it receives an interrogatory signal-wave. An antenna control means transmits the call signal-wave and the carrier radio-wave when it receives the call-back signal-wave and transmits an interrogatory signal-wave and carrier radio-wave when it receives said answering signal. The antenna control means is also used for identifying the automobile. An area setting means decreases output power of the antenna to a prescribed level during the transmission of call signal-wave.

Another object of the invention is to provide a mobile object identification device which includes, in addition to the structure discussed above, a plurality of antennas which transmit and receive radio wave signals of different frequencies. These frequencies are assigned in a given frequency domain of the IU to and from a plurality of the communication areas overlapping one another. A control means provides different timings of its output signals corresponding to the communication areas of the antennas.

Thus, the antenna installed on the toll gate can receive the responding signal in the antenna receiving area. The antenna receiving area substantially coincides with the antenna transmitting area when the responder unit receives the communication signal in the antenna transmitting area, thereby ensuring the reliable communication with the IU without communication failure.

When the IU mounted on an automobile enters the transmitting area and receives a call signal-wave, it composes a call-back signal-wave by modulating the received carrier radio-wave with call back data. The IU then transmits the call-back signal-wave to the outside. The level of the call-back signal-wave at the moment of transmission is lower than the level of the unmodulated-carrier-radio-wave generated by the control means since the call-back signal-wave only utilizes the unmodulated-carrier-radio-wave transmitted from an outside antenna. Therefore, the area setting means decreases the antenna output power to a prescribed level to narrow the transmitting area when the control means transmits a communication signal such as a call signal-wave or an interrogatory signal-wave. The control means restores the antenna output power to its original level when the control means transmits the unmodulated-carrier-radio-wave.

When the control means receives the call-back signal-wave, the antenna transmits the interrogatory signal-wave, and subsequently, the unmodulated-carrier-radio-wave. When the responder unit receives the interrogatory signal-wave, it composes the answering data and receives the subsequent unmodulated-carrier-radio-wave. The responder unit then modulates the unmodulated carrier radio wave with the answering data, and transmits it as an answering signal to the antenna. When the antenna completes the communication, it transmits the call signal-wave again.

As a result, when the IU receives the call signal-wave in the transmitting area, the antenna can receive the call-back signal-wave in the receiving area which substantially coincides with the transmitting area. Thus, reliable communication is ensured without failure. Further, when one IU in the communication area receives the interrogatory signal-wave and other responder units in the same communication area do not receive the call signal-wave, the interrogatory signal-wave is transmitted only to the one IU which has received the call signal-wave. Thus, only its call-back signal-wave is received by the antenna, and the call signal-wave for the other IU is subsequently transmitted to achieve successive communication.

The control means outputs its signals at different times to a plurality of antennas which have transmitting areas overlapping one another. Thus, when an automobile is in the overlapping communication area, its IU receives either one of the communication signals from the antennas.

Since the communication signals and the unmodulated-carrier-radio-waves transmitted from the different antennas have different frequencies, communication with only one antenna is ensured. Thus, reliable communication covering a broad area without leaving void area is provided.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 4 is a chart illustrating frequency characteristics of an IU and antennas of the device according to the embodiment;

FIG. 5A, 5B, 5C, 5D and 5E are timing charts of an interrogatory-data signal of the device according to the embodiment;

DETAILED DESCRIPTION OF THE PREFERRED EMBODIMENT

A toll collecting system for a toll road according to an embodiment of the present invention is described with reference to FIGS. 1–10.

Figure 2:
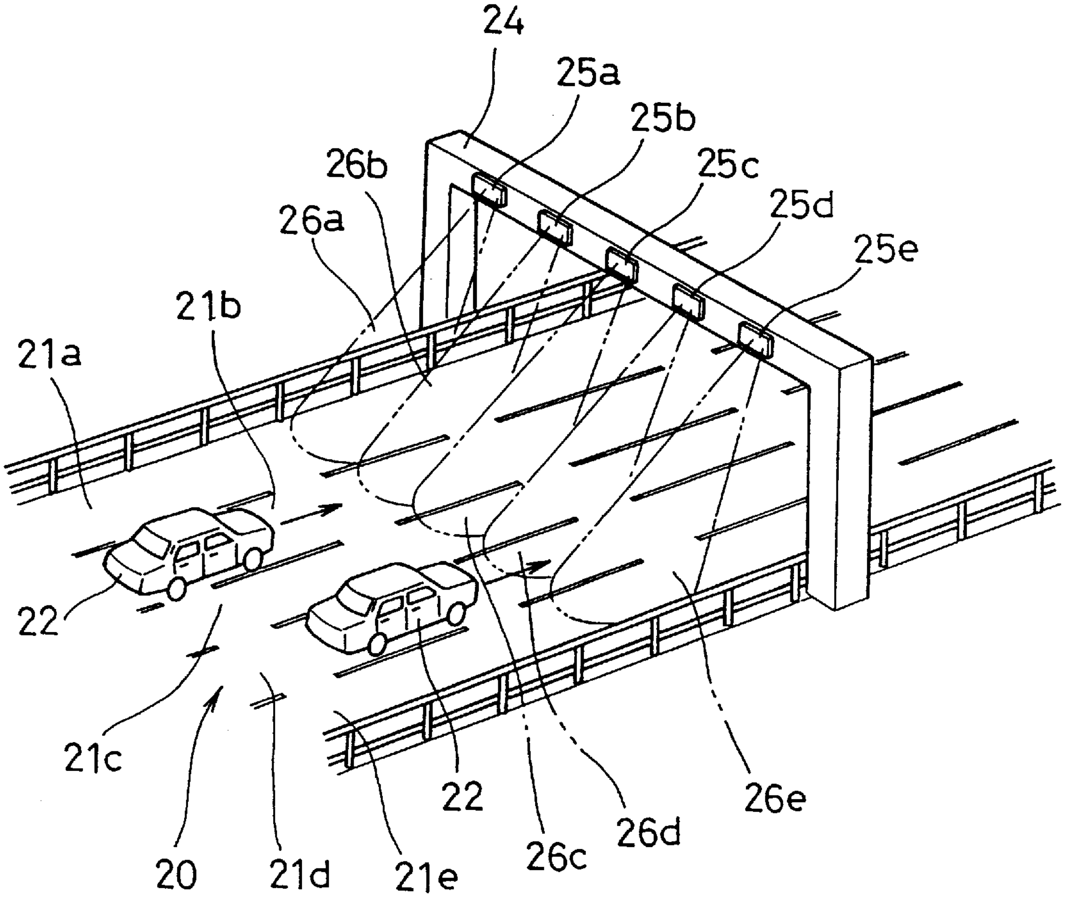
FIG. 2 is an overall perspective view illustrating the device according to the embodiment.
Figure 3:
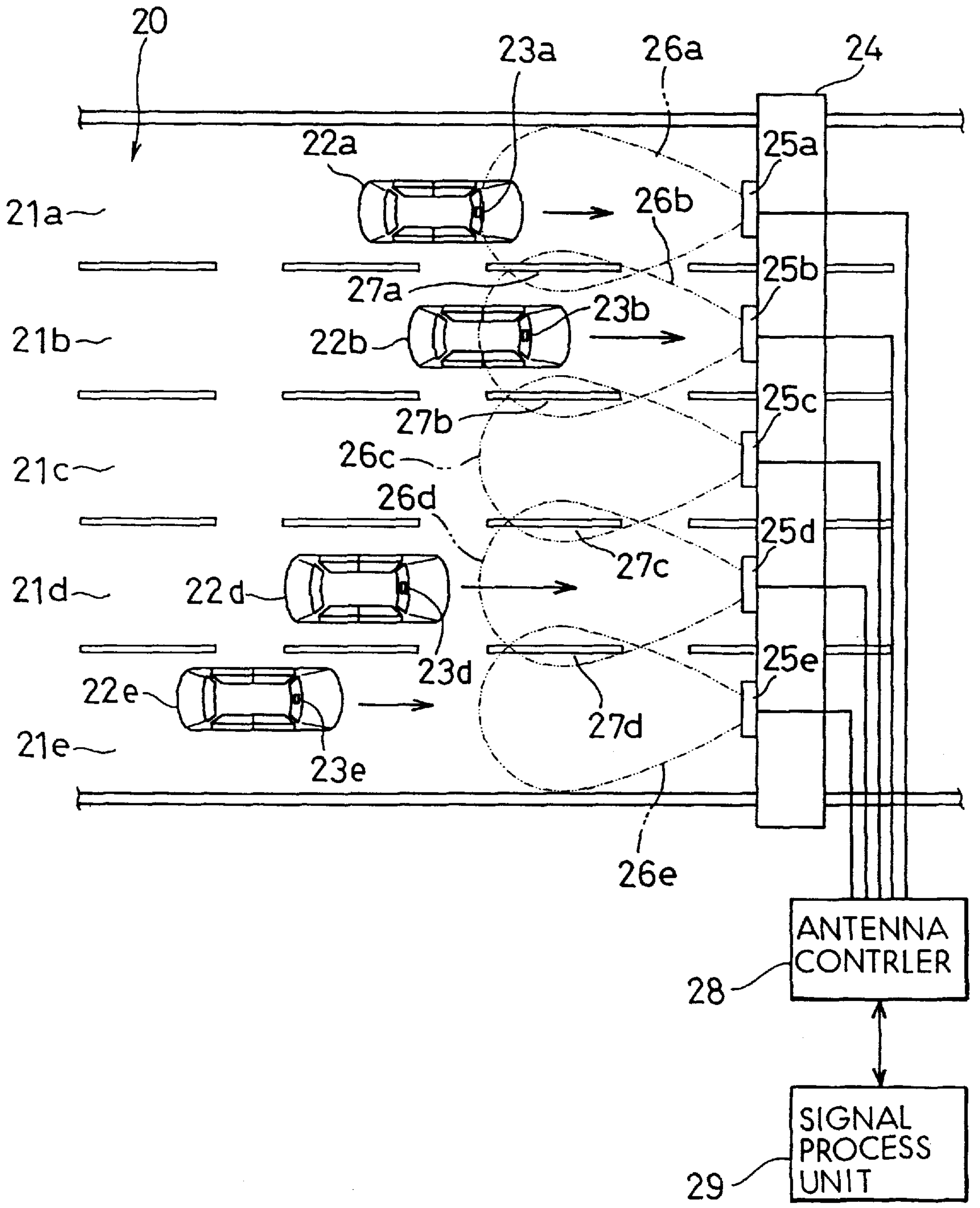
FIG. 3 is an overall schematic view of the device according to the embodiment.

An overall perspective view of a toll road 20 is illustrated in FIG. 2. The toll road 20 has five passing lanes 21*a* through 21*e*. Two automobiles 22, are each equipped with an IU (In-vehicle Unit or responding unit) 23 which is disposed on an upper central portion of the windshield glass of each of the automobile 22. Each automobile runs on the toll road as shown in FIG. 3. A gate 24 is built to cross the toll road 20 and is equipped with a plurality (in this case, five) of antenna units 25*a* through 25*e* above the lanes 21*a* through 21*e*, respectively. Each of the five antennas 25*a* through 25*e* faces the road surface obliquely downward. Communication areas 25*a*–26*e* thereof are arranged so that the adjacent ones overlap partly with each other to form overlapping-communication areas 27*a*–27*d* as shown in FIG. 3.

Figure 1:
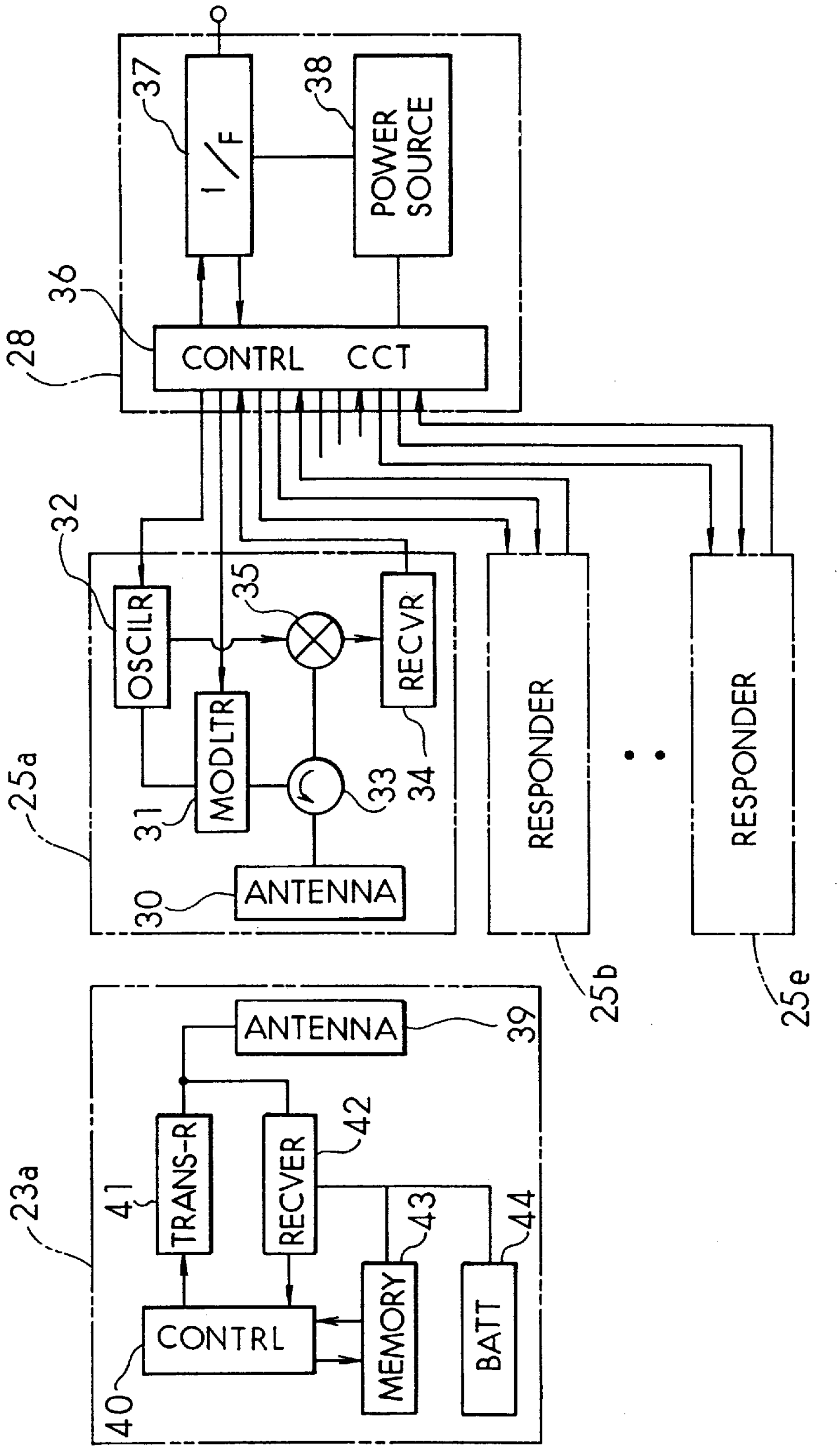
FIG. 1 is a block diagram illustrating a mobile object identification device according to an embodiment of the present invention.

The antenna units 25*a*–26*e* are connected to an antenna controller 28 as shown in FIG. 1. The antenna controller 28 controls the antennas 25*a*–2*e* to transmit and receive signals and to exchange data between a host computer and a signal-processing-unit 29 shown in FIG. 3.

The structure of the antenna units 25*a*–26*e* is described below with reference to FIG. 1.

A transmitting and receiving antenna 30 is an array antenna which is a plurality of patch antennas. The patch antennas are composed of micro-strip lines formed on a printed board in order to increase the directivity of the antenna and the communication distance. A modulating circuit 31 modulates a carrier radio-wave having the frequency f1 which is generated by an oscillator 32 with an interrogatory data-signal received from the controller 28. The modulating circuit generates a modulated-carrier-wave as an interrogatory signal-wave Sk on the antenna 30 through a circulator 33. The frequency f1 of the carrier radio-wave generated by the oscillator 32 is one in the assigned frequency band, for example, 2.45 G Hz. The antenna 30 receives only a limited range of the radio wave frequency f1 generated by the oscillator 32.

A signal receiving circuit 34 (hereinafter referred to as the receiving circuit) for signal-processing such as demodulation is connected to a mixer 35. The mixer 35 is supplied with the carrier-radio-wave from the oscillator 32 and a responding signal-wave (which is a carrier-radio-wave modulated with a responding data signal) coming from the antenna 30 through the circulator 33. The carrier-radio-wave and the responding signal-wave are mixed by the mixer 35 and supplied to the receiving circuit 34. The receiving circuit 34 demodulates the mixed signal-wave, obtains the responding data signal and send it to the controller 28.

Other antenna units 25*b*–25*e* are the same in the structure as the antenna unit 25*a* except for their frequencies. That is, the frequency f1 is generated by the oscillator 32 for the antenna unit 25*a*, and the frequencies f2–f5 for the antenna units 25*b*–25*e* are respectively generated in narrow frequency bands so as not to overlap with one another. These oscillation frequencies are assigned in the previously mentioned fixed frequency band (2.45 G Hz band). The frequencies for the adjacent antenna units are assigned to differ from each other as much as possible.

In the antenna controller 28, a control circuit 36 includes a CPU (not shown), and is connected to respective modulating circuits 31, receiving circuits 34 and the oscillator 32 of the antenna units 25*a*–25*e*. The antenna controller 28 executes a program (discussed below) and generates an interrogatory data-signal to the modulating circuit 31 at a timing (discussed below). It also receives a responding data-signal through the receiving circuit 34, and decreases the output power of the oscillator 32 to a prescribed level when a pilot signal-wave Sp is output (discussed below). The control circuit 36 is connected through an interface circuit 37 to the signal-processing-circuit 29 which is previously described (see FIG. 3). A power supplying circuit 38 converts an AC current supplied from an electric source (not shown) to a DC current and supplies it to the control circuit 36 and the interface circuit 37 as well as the respective antenna units 36*a*–36*e*.

In the IU 23, an antenna 39 is a micro-strip-antenna formed on a printed board and is arranged to receive radio waves in a broad frequency band as shown by a broken line in FIG. 4. That is, it can receive all the frequencies f1–f5 of the interrogatory signal-waves Sk transmitted from the respective antenna units 25*a*–25*e*.

The control circuit 40 includes a CPU, a ROM and a RAM, and generates responding data-signals for a call-back signal-wave (or pilot-responding signal-wave) and answering signal-wave (or interrogatory-responding signal-wave) when it receives a pilot signal-wave Sp or an interrogatory signal-wave Sk from the outside. In the meantime, the pilot signal-wave Sp causes the CPU of the control circuit 40 to start its operation and so that information can be received from an automobile about its identification code. The interrogatory signal-wave Sk causes the CPU to read data stored in the ROM and/or RAM of the control circuit 40, or to write data to the RAM for the toll collection. The control circuit 40 is connected to the antenna 39 through a transmitting circuit 41 and a receiving circuit 42.

The transmitting circuit 41 modulates an unmodulated-carrier-radio-wave which is received from the antenna 39 with a responding signal such as the call-back signal-wave. The modulating circuit 41 transmits the modulated-carrier-wave as a responding signal-wave such as the call-back signal-wave Ap. The receiving circuit 42 demodulates the interrogatory signal-wave Sk received from the antenna 39 to obtain an interrogatory data-signal, and sends it to the control circuit 40. The control circuit 40 is connected to a data memory 43 which is a non-volatile read-write memory. The control circuit 40 does not transmit any signal-wave even if it receives the interrogatory signal-wave Sk, until it receives the pilot signal-wave Sp. After the control circuit 40 has started its communication with one of the antenna units 25*a*–25*e*, it will not start communication with another antenna unit. When a series of toll collection processes have been done, the control circuit 40 stops its communication and does not start its communication for a period of time or after running a given distance. A battery 44 energizes respective circuits in the IU 23*a*.

The operation of the above embodiment is described with reference to FIG. 5–FIG. 10. The control circuit 36 of the antenna controller 28 generates communication data-signals, In this case, antenna controller 28 generates a pilot data-signal (described below) and an interrogatory data-signal and supplies them to the respective antenna units 25*a* through 25*e* at timings shown in FIG. 5. The antenna controller 28 sends the communication data-signals repeatedly to odd-ordered antenna units 25*a*, 25*c* and 25*e* at the same timing during each cycle time T1. The antenna controller sends communication data signals to even-ordered antennas 25*b* and 25*d* during each the same cycle time T1, but specifically at a time T2 (e.g. T1/2) later than the former.

In the respective antenna units 25*a*–25*e*, the modulation circuit 31 modulates the carrier-radio-wave with the communication data-signals, and transmits the communication signal-waves to the respective communication areas 26*a*–26*e* by the antennas 30.

In this case, there are two kinds of the communication data-signals, the pilot data-signal and the interrogatory data-signal. They are generated repeatedly during a period ta within the output cycle time T1. The remaining cycle time tb (ta+tb=T1) is set to receive the responding signal-waves or data-signals (which are obtained after the responding signal waves are demodulated). The output period ta for the pilot data-signal and the interrogatory data-signal is arranged not to overlap with those from the adjacent antenna units, for instance, antenna units 25*a* and 25*b*.

During the cycle time tb (tb=T1−ta, as shown in FIG. 5) in which the communication data-signals are not supplied by the controller 28 and the modulation is not made by the modulating circuit 31, the unmodulated-carrier-radio-waves is generated by the oscillators 32 and is transmitted by the respective antenna units 25*a*–25*e* to the respective communication areas 26*a*–26*e*. That is, the respective antenna units 25*a* through 25*e* always transmit radio-waves which include the pilot signal-wave Sp(carrying the pilot data-signal) and the interrogatory signal-wave Sk(carrying the interrogatory data-signal) transmitted during the period ta within the cycle time T1.

The output power level of the antennas 30 of the respective antenna units 25*a*–25*e* is arranged so that the level of the pilot signal-wave Sp becomes L1 and the level of the interrogatory signal-wave Sk and the unmodulated-carrier-radio-wave becomes L2. L2 is a given level higher than the output power level of L1. The receiving and transmitting of the signal-waves by the antenna units 25*a*–25*e* are controlled according to a communication program shown in FIG. 6. The corresponding operations by the IU 23 are controlled according to a communication program shown in FIG. 7.

Figure 6:
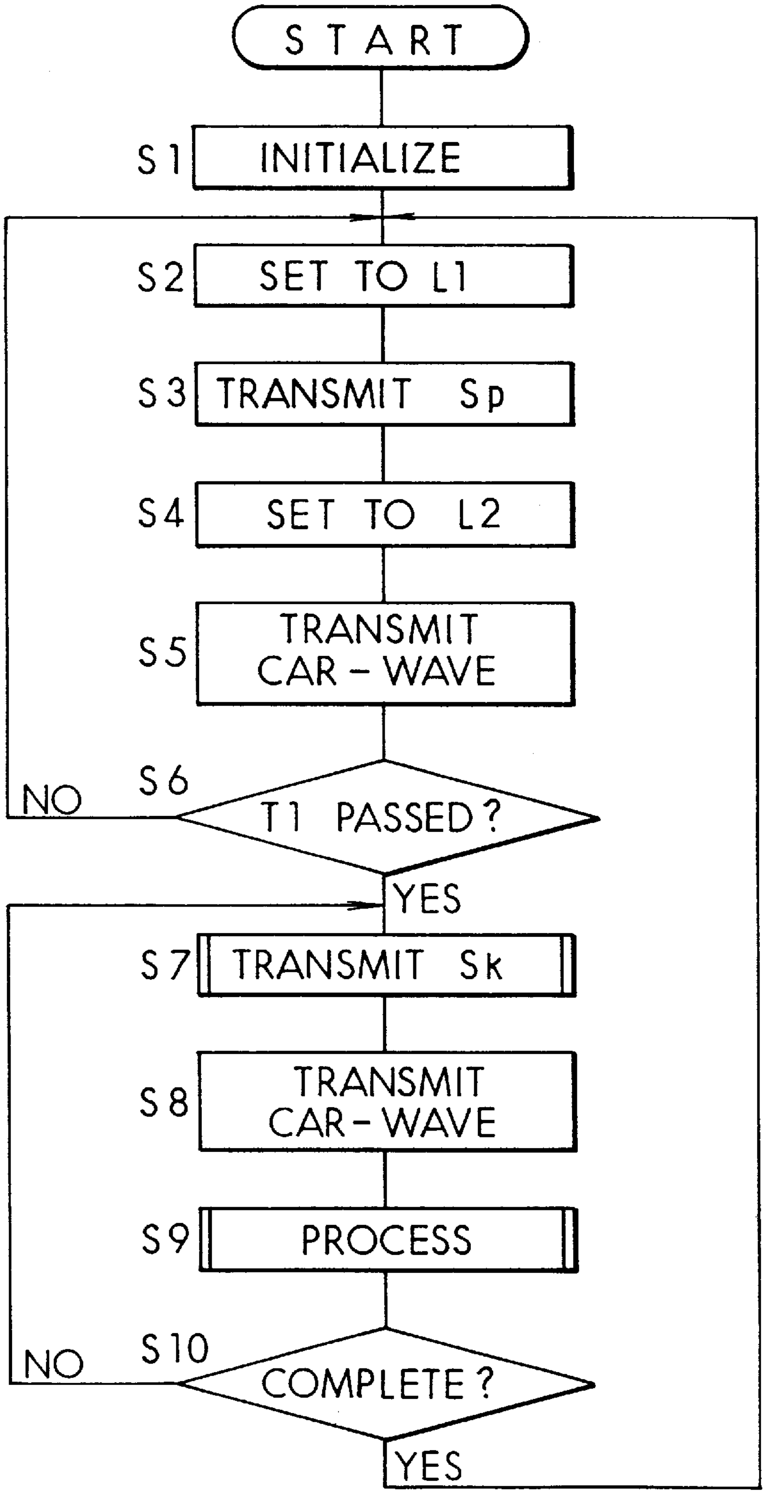
FIG. 6 is a flow chart of a control program of an antenna of the device according to the embodiment.

The control circuit 36 starts to control the antenna units 25*a*–25*e* according to the communication program after its initialization (step S1) shown in FIG. 6. The oscillator 32 sets the output level of the antenna 30 to L1 (step S2), and subsequently, pilot signal-wave Sp is transmitted (step S3). Then, the oscillator 32 sets the output level of the antenna 30 to L2 (L2>L1) (step S4) and the unmodulated-carrier-radio-wave is transmitted (step 4), and the arrival of the call-back signal-wave Ap is waited for until the cycle time T1 terminates.

If the antenna units 25*a*–25*e* have not receive the call-back signal-wave Ap during the cycle time T1, [NO] is determined in a step S6 and the program returns to the step S2. The steps S2–S6 are repeated until the call-back signal-wave Ap is received, i.e., until the IU 23 comes into any one of the communication areas 26*a*–26*e*. If the call back signals-wave is received, [YES] is determined in step S6. Then, the program proceeds step S7 and the antenna units 25*a*–25*e* transmit the interrogatory signal-wave Sk to read data for toll collection from the IU 23 (step S7). Thereafter, they transmit the unmodulated-carrier-radio-wave (step S8) and wait for receiving the interrogatory-responding-signal-wave (hereinafter referred to as answering signal-wave) Ak from IU 23. Signal processing is executed if they receive the answering signal wave (step S9).

If data writing is necessary in addition to data reading, the antenna units 25*a*–25*e* transmit the interrogatory signal-wave Sk which includes data to be written into the IU 23 before the communication is completed. In this case, [NO] is determined in a step S10 and the program returns to the step S7. Then, the interrogatory signal-wave Sk is transmitted (step S7) and the program goes through the steps S8 and S9 to the step S10, where [YES] is determined and the communication is stopped when the transmission of the interrogatory signal-wave is completed. Then, the program returns to the step S2 to repeat the above-described operations.

The output level L1 is set only while the pilot signal-wave Sp is being transmitted and the output level L2 is set while the interrogatory signal-wave Sk and the unmodulated-carrier-radio-wave are being transmitted. Thus, the communication area 26*a*–26*e* of the pilot signal-wave Sp which can be received by the IU 23 substantially coincides with the communication areas of the call-back signal-wave Ap and the answering signal Ak which can be received by the antenna 30.

Figure 7:
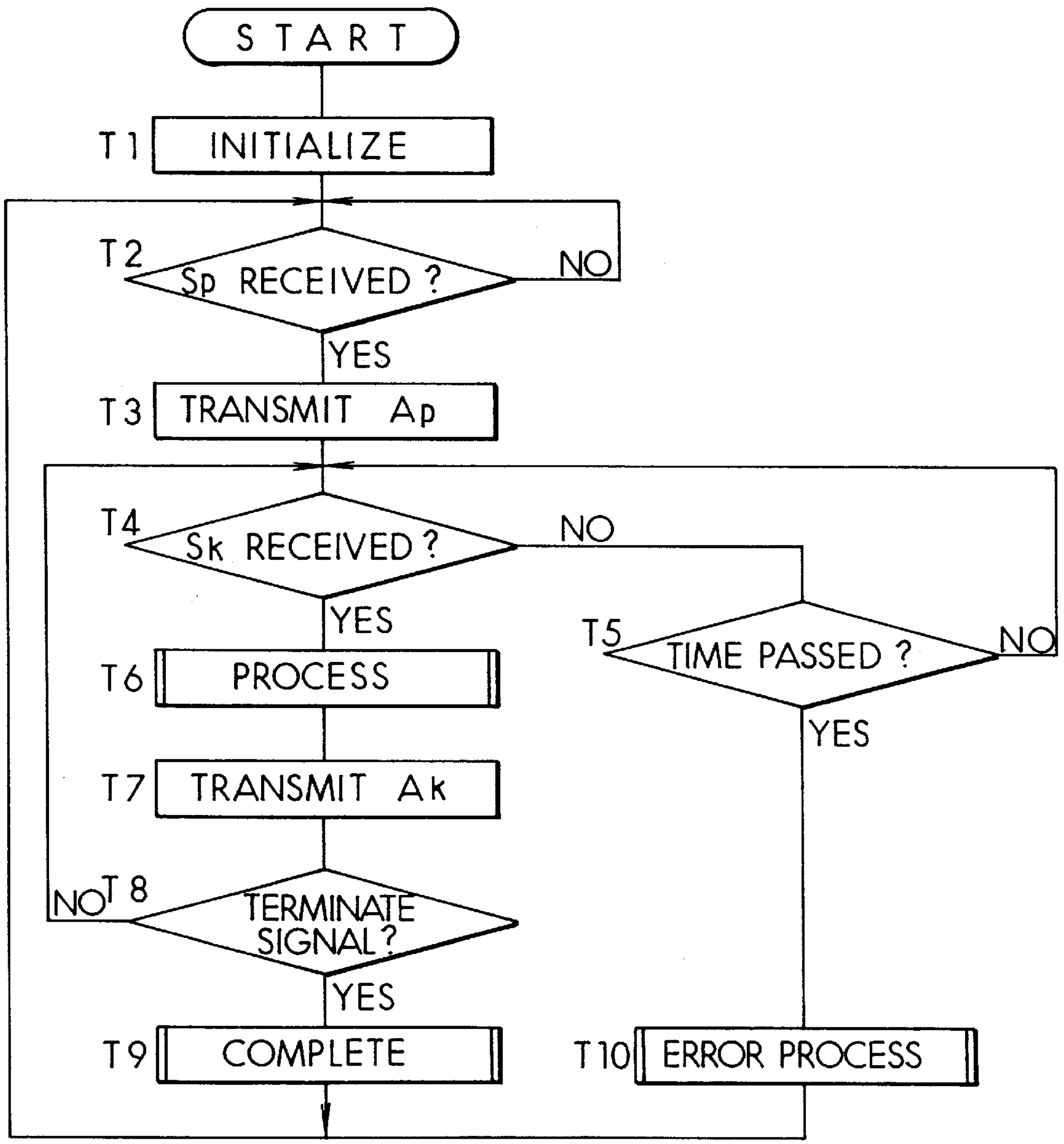
FIG. 7 is a flow chart of a control program of an IU of the device according to the embodiment.
Figures 8A, 8B, 8C, 8D:
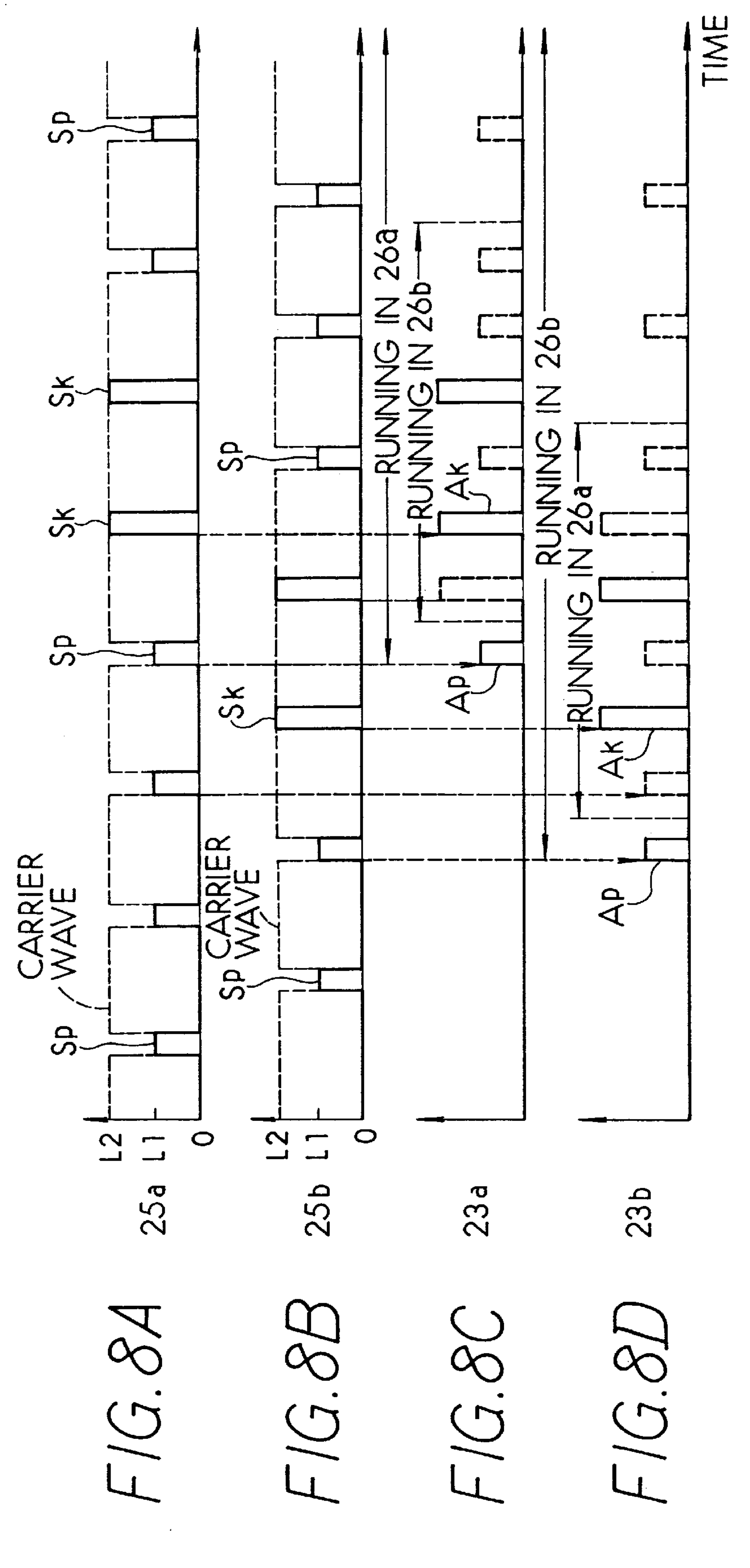
FIG. 8A–8D are time charts showing the timings of the communication between the antenna and the IU according to the embodiment.

When the IU 23 is operated according to the communication program shown in FIG. 7, an initialization is executed in a step T1. The IU 23 then waits for the pilot signal-wave Sp (step T2). When it comes into any one of the communication areas 26*a*–26*e*, the IU 23 and receives (by the antenna 39) the pilot signal-wave Sp transmitted from the antenna units 25*a*–25*e*. The signal-wave is demodulated by the receiving circuit 42 and applied to the control circuit 40. A determination of [YES] is made in step T2, and the program goes to the next step T3. The IU 23 receives the unmodulated-carrier-radio-wave by the antenna 39. Subsequently, the IU modules it with the call-back data-signal outputted through the transmitting circuit 41, and transmits the call-back signal-wave Ap, the modulated-carrier-radio-wave (step T3) . Thereafter, steps T4 and T5 are repeated until the interrogatory signal-wave Sk is received.

When the IU 23 receives the interrogatory signal-wave Sk from any one of the antenna units 25*a*–25*e*, signal processing for transmitting or writing data of the toll collection is performed according to the contents of the interrogatory signal-wave Sk. If the data is to be stored in memory, the data are written into the data memory 43 by the control circuit 40. If there are data to be read, the data are read from the data memory 43 (step T6). Thereafter, the answering signal-wave Ak is composed, i.e., the unmodulated-carrier-radio-wave is modulated (step T7). When the interrogatory signal-wave Sk does not include a termination signal of the communication, the IU 23 determines [NO] in step T8 and returns to step T4 where it waits for the interrogatory signal-wave Sk again. On the other hand, when it includes the termination signal, the IU 23 determines [YES] in step T8. The termination of the communication is then executed (step T9), and returns to the step T2.

If the IU 23 has not received the interrogatory signal-wave while the steps T4 and T5 are repeated in a given period, [YES] is determined in step T5 and a communication error process is performed (step T10). As a result, the IU 23 returns to step T2 and waits for the pilot signal-wave Sp again.

Although the step is not convenient in case of a system trouble, it ensures to receive the signals when the IU 23 passes the next gate.

If two automobiles 22*a* and 22*b* are moving in respective lanes 21*a* and 21*b* and are approaching the gate 24, the IU 23*a* and the IU 23*b* eventually enter into the communication areas 26*a* and 26*b*. While the pilot signal-wave Sp is transmitted to the respective communication areas 26*a*–26*e* as shown in FIG. 3, the IU 23*b* receives the pilot signal-wave Sp first from the antenna unit 25*b* and transmits the call-back signal-wave Ap. The IU 23*b* also transmits the answering signal-wave Ak in response to the interrogatory signal-wave Sk. Thereafter, the IU 23*a* receives the pilot signal-wave Sp from the antenna unit 25*a* and the same processes as above are performed.

Thus, when the automobiles 22*a* and 22*b* pass the gate 24, the data communication for the toll collection is performed automatically between the gate 24 and the IU 23*a* and IU 23*b*. Since the communication areas where the pilot signal-wave (transmitted from the antenna units 25*a*–25*e*) can be received by the IU 23*a* and IU 23*b* becomes almost the same as the communication areas where the IU 23*a* and the IU 23*b* can transmit the call-back signal-wave Ap, reliable communications are ensured.

If the automobile 22*b* in FIG. 3 passed through the communication area 26*b* and then enters to the communication area 26*a*, the IU 23*b* transmits the call-back signal-wave Ap in response to the pilot signal-wave Sp from the antenna 25*b*. The IU 23*b* does not respond to the pilot signal-wave from the antenna 25*a*. That is, the IU 23*b* only communicates with the antenna unit 25*b*, and the IU 23*a* likewise only communicates with the antenna unit 25*a*. The IU 23*a* and IU 23*b* do not start communications for a period of time or until a short-distance-running after the toll collection process has been completed. Thus, they do not transmit the call-back signal-wave Ap even if they receive the pilot signal-wave Sp from the antenna units 25*a* and 25*b* after the toll collection process has been completed.

Figure 9:
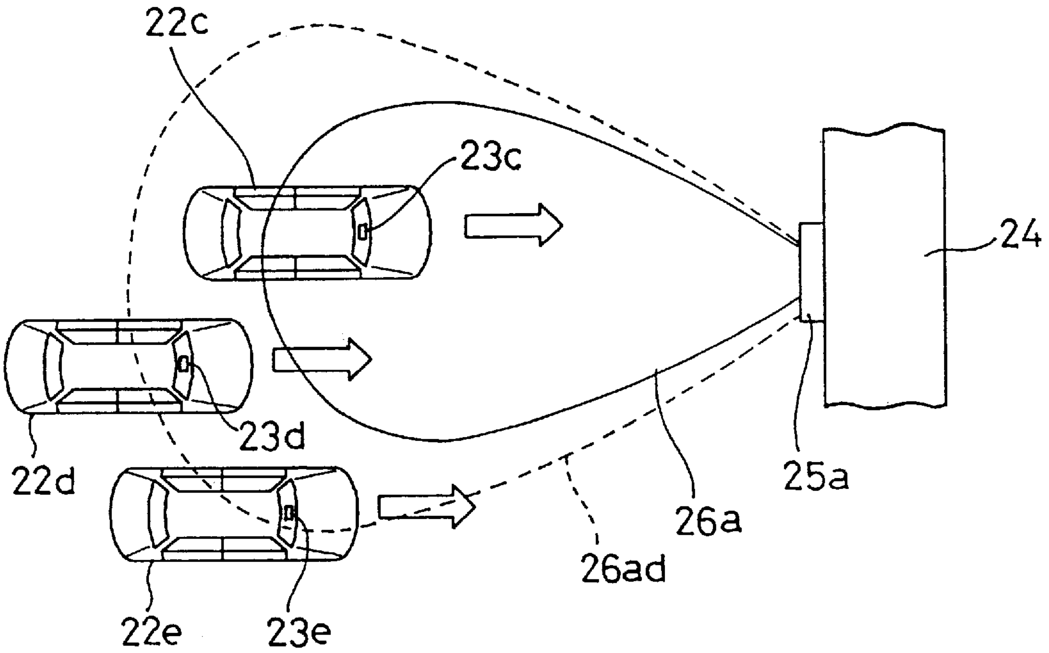
FIG. 9 is an explanatory chart illustrating the communication when two automobiles enter a communication area.
Figures 10A, 10B, 10C, 10D:
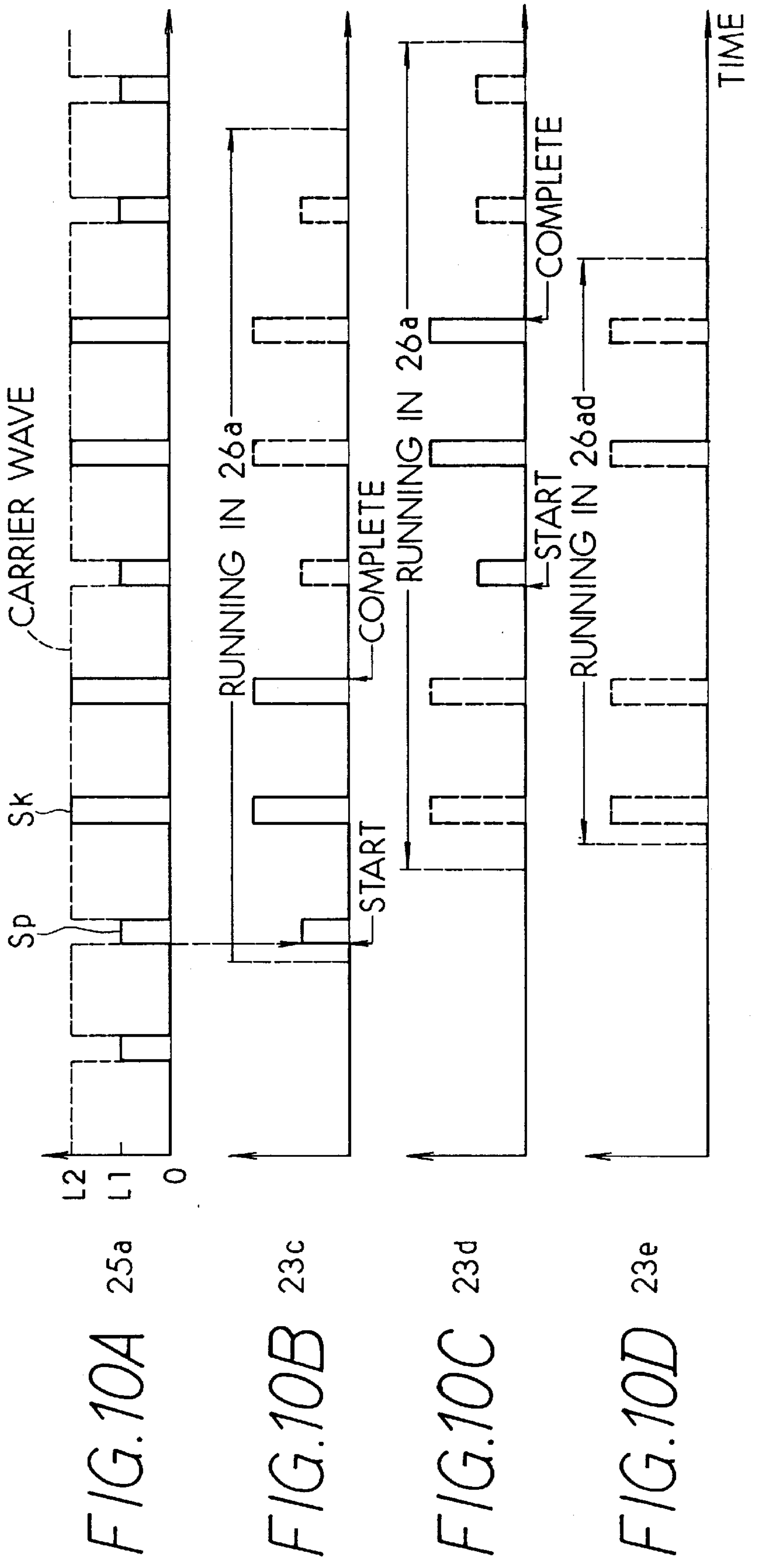
FIG. 10A–10D are charts corresponding to FIG. 8 showing the communication timings when two automobiles enter a communication area.
Figure 11:
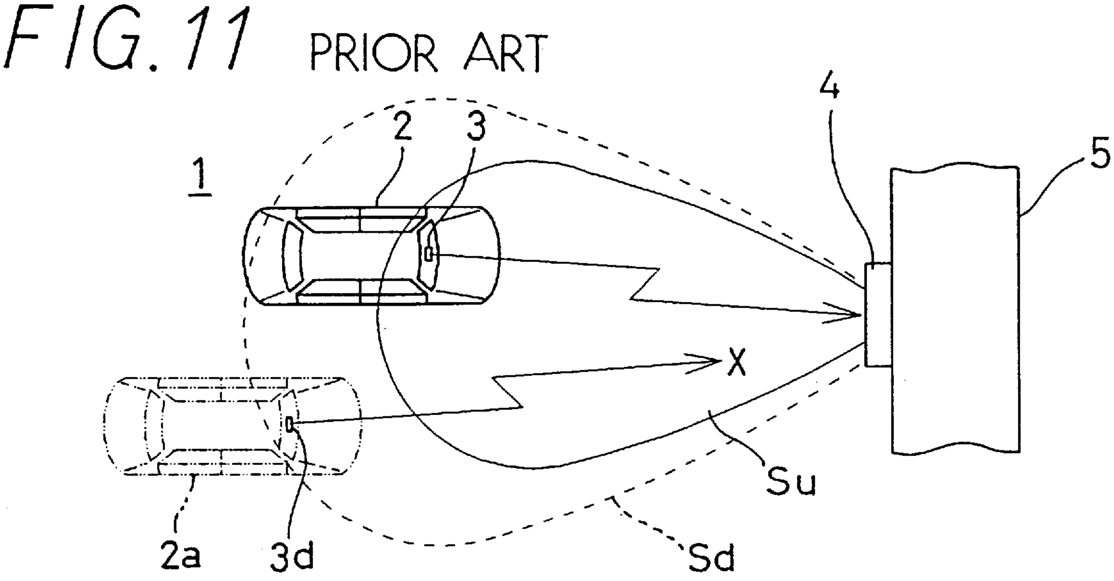
FIG. 11 PRIOR ART
FIG. 11 is a schematic view illustrating a communication area in a conventional system.
Figure 12:
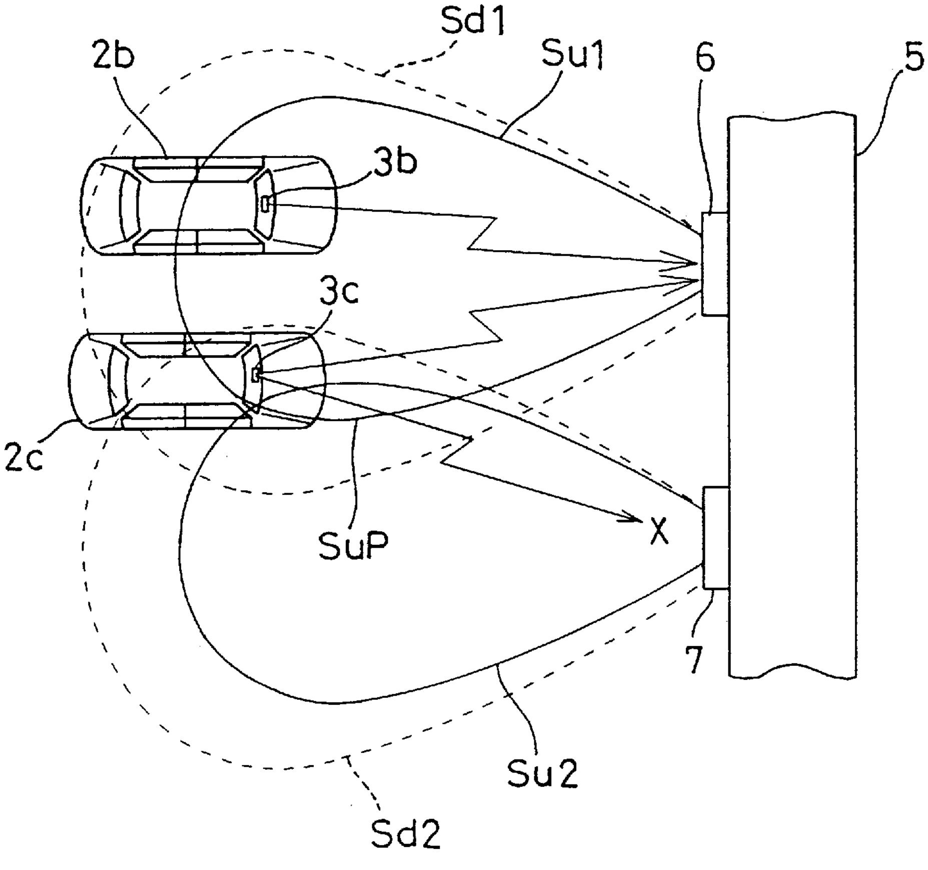
FIG. 12 PRIOR ART
FIG. 12 is an explanatory schematic view when a communication problem is caused.

A case where three automobiles 22*c*–22*e* are passing the communication area 26*a* as shown in FIGS. 9 and 10 is described below. FIG. 9 shows the automobile 22*c* entering the communication area 26*a* first, the automobile 22*d* subsequently entering the communication area 26*a*, and the automobile 22*e* passing a downlink area 26*ad* outside the communication area 26*a*. In communication area 26, signals other than the pilot signal-wave Sp (lower level signal-wave) of the antenna unit 25*a* may be received.

FIG. 10 shows that the IU 23*c* of the automobile 22*c*, which already entered the communication area 26*a*, receives the pilot signal-wave Sp from the antenna unit 25*a* and responds to the signal to start its communication. Although the automobile 22*d* enter the communication area 26*a* during the communication of the IU 23*c*, the IU 23*d* does not start its communication even if it receives the interrogatory signal-wave Sk since the antenna unit 25*a* is in communication with the IU 23*c* and the interrogatory signal-wave Sk is being transmitted.

When the communication between the IU 23*c* and the antenna unit 25*a* has been completed and the pilot signal-wave Sp is re-transmitted from the antenna unit 25*a*, the IU 23*c* receives the signal-wave and starts the communication. Since the IU 23*c* has completed its communication at this moment, it neglects the pilot signal-wave Sp even if it subsequently receives the signal. Thus, the IU 23*d* solely communicates with the antenna unit 25*a*.

The IU 23*e* of the automobile 22*e* passing through the downlink area 26*ad* does not receive the pilot signal-wave Sp since it passes outside the communication area 26*a*. Thus, the automobile 22*e* passes without communication even if it receives the interrogatory signal-wave Sk. However, in practice, automobile 22*e* passes the communication area 26*b* of the antenna unit 25*b* as shown in FIG. 3. The IU 23*e* receives the pilot signal-wave Sp from the antenna unit 25*b* and starts its communication.

When the IU 23 of the automobile enters a communication area 27*a*, where the communication areas 26*a* and 26*b* of the antenna units 25*a* and 25*b* overlap with each other, the IU 23 receives the pilot signal-wave from either one of the antenna units 25*a* and 25*b*. Since the antenna units 25*a* and 25*b* transmit the pilot signal-wave Sp at different times (as discussed above) steady communication of the IU 23 with either one of the antenna units 25*a* and 25*b* is ensured.

Since the communication time is not shared by the antenna units 25*a* and 25*b*, it is not limited as compared to the ordinary time-sharing communication. Therefore, communition with the IU 23 of the automobile can be sufficiently secured even while the automobile is running at a high speed. Thus, reliable communication with the antenna unit 25*a* or 25*b* and, consequently, reliable identification can be achieved. The present embodiment has the following effects.

First, when the antenna units 25*a*–25*e* transmit the pilot signal-wave, the output level L1 is set to be lower than the output level L2 for the other signals. As a result, when the IU 23 has received the pilot signal-wave Sp in one of the communication areas 26*a*–26*e*, it then modulates the unmodulated-carrier-radio-wave which is subsequently received at an increased power level. The IU 23 then transmits the wave as the call-back signal-wave to the corresponding antenna units without fail. Since the antenna units 25*a*–25*e* transmit the interrogatory signal-wave Sk at the higher output level L2, the IU 23 can receive the signal-wave without fail.

The communication times for the pilot signal-wave Sp and for the interrogatory signal-wave between IU 23 and the antenna units 25*a*–25*e* are separated so that IU 23 receives the interrogatory signal-wave Sk only after it receives the pilot signal-wave Sp. If one of the IUs 23 receives the interrogatory signal-wave Sk while running in one of the communication areas, another of the IUs 23 entering the same communication area will receive the pilot signal-wave Sp after the former communication completes. Thus, the communication may be achieved without interference of the two IUs 23.

Since the frequencies f1–f5 of the oscillators 32 are assigned to narrow frequency bands and the controller 28 shifts the timing of the pilot signal-wave Sp of the adjacent antennas by a period T2, the respective antenna units 25*a*–25*e* can communicate with the respective IUs 23 of the automobiles 22 without interference in a short time period.

The modulating circuit 31 may be arranged to control the oscillator 32 to transmit the unmodulated-carrier-radio-wave automatically from the antenna units 25*a*–25*e* whenever none of the pilot signal-wave Sp or interrogatory signal-wave Sk is transmitted.

The data memory 43 of the IU 23, which is integrated into a unit, may be separated as a detachable member such as a memory card or a prepaid card.

The communication may be completed by only one time interrogatory signal-wave by combining the pilot signal-wave Sp and the interrogatory signal-wave Sk.

The communication areas formed by more than three overlapping areas may be provided without failure by transmitting pilot signal-wave Sp and the interrogatory signal-wave Sk transmitted from the respective antenna units at different times. Thus, communication interference is prevented. In the communication area which has no overlapping area, the same wave may be used.

The present invention for the toll collection system of the toll road may be applied to a system such as an operating system for an unmanned carrier which carries products in a plant, a production control system for controlling the production line of a plant, an access control system which controls people coming in or going out of rooms, or any like system.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. A mobile object identification device for a communication area where information is exchanged between a mobile object and a station comprising:

an antenna control unit having an antenna disposed at said station for repeatedly transmitting a communication signal-wave, which includes a pilot signal and an interrogatory signal in a portion of a cycle time of said communication signal-wave and an unmodulated carrier-radio-wave through said antenna toward said communication area, and for receiving a responding signal-wave from said communication area in another portion of said cycle time; and a responder unit mounted on said mobile object for transmitting said responding signal-wave when receiving said pilot signal and said unmodulated carrier-radio-wave subsequently, said responder unit including:

a receiving circuit receiving said unmodulated carrier-radio-wave from said communication area, a control circuit generating a responding data-signal, and a transmitting circuit modulating said unmodulated carrier-radio-wave with said responding data-signal and transmitting a modulated carrier-radio-wave as said responding signal-wave; wherein said antenna control unit comprises:

means for decreasing output power of said antenna to a prescribed level while said antenna control unit is transmitting said pilot signal of said communication signal-wave, said prescribed level being lower than the level of the output power of said antenna while said antenna control unit is transmitting said unmodulated carrier-radio-wave, to thereby decrease said communication area, and means for switching said pilot signal to said interrogatory signal when an acknowledgment of said pilot signal is received by said antenna control unit.

2. A mobile object identification device claimed in claim 1 further comprising a gate for toll collection, wherein said antenna is disposed on said gate.

3. A mobile object identification device claimed in claim 2, wherein said antenna control unit further comprises means for transmitting said unmodulated carrier-radio-wave subsequent to said interrogatory signal.

4. A mobile object identification device claimed in claim 3 further comprising a signal-processing-circuit for processing data for said toll collection when receiving said responding signal-wave.

5. A mobile object identification device claimed in claim 2, wherein said antenna control unit further comprises a plurality of antennas disposed on said gate.

6. A mobile object identification device claimed in claim 5, wherein said antenna control unit further comprises a means for generating a plurality of said carrier-radio-waves having different frequencies and respectively assigning said carrier-radio-waves to said plurality of antennas corresponding to said communication areas overlapping with one another.

7. A mobile object identification device claimed in claim 6, wherein said means for generating a plurality of carrier-radio-waves having different frequencies further comprises circuit means for supplying said communication signal-waves to said plurality of antennas at different times.

8. A mobile object identification device claimed in claim 4, wherein said responder unit includes a communication program which controls said responder unit to stop communication for a given period after said toll collection process has been completed.

9. A mobile object identification device claimed in claim 4, wherein said responder unit includes a communication program which controls said responder unit to stop communication until a given running distance after said toll collection process has been completed.

10. A mobile object identification device claimed in claim 3, wherein said responder unit includes a communication program which controls said responder unit to stop communication until it has received said pilot signal-wave.

11. A mobile object identification device claimed in claim 10, wherein said antenna control unit includes a plurality of antennas; and said responder unit includes a communication program which controls said responder unit to prohibit communication with other antennas when it has received a pilot signal-wave from one of said plurality of antennas.

12. A mobile object identification device claimed in claim 10, wherein:

said antenna control unit comprises means for transmitting a pilot signal-wave and an unmodulated-carrier-radio-wave; and said means for transmitting said pilot signal-wave and interrogatory signal-wave transmit said pilot signal-wave at a power level lower than said interrogatory signal-wave.

13. A mobile object identification device claimed in claim 10, wherein:

said antenna control unit comprises means for transmitting an unmodulated-carrier-radio-wave; and said means for transmitting said unmodulated-carrier-radio-wave transmits said unmodulated carrier-radio-wave at the same power level as said interrogatory signal-wave.

14. A mobile object identification device claimed in claim 1, wherein said antenna control unit further comprises a plurality of antennas disposed on a gate.

15. A mobile object identification device claimed in claim 14, wherein said antenna control unit further comprises means for generating a plurality of carrier-radio-waves having different frequencies, and respectively assigning said plurality of carrier-radio-waves to said plurality of antennas corresponding to said communication areas which overlap with one another.

16. A mobile object identification device claimed in claim 15, wherein said means for generating a plurality of said carrier-radio-waves having different frequencies further comprises circuit means for supplying said communication signal-waves to said antennas at different times.

17. A mobile object identification device claimed in claim 1, wherein said pilot signal indicates that said mobile object has entered said communication area.

18. A mobile object identification device claimed in claim 1, wherein said unmodulated carrier-radio-wave is transmitted after said pilot signal.

19. A mobile object identification device claimed in claim 1, wherein said mobile object is mounted on an automobile, and said station is disposed at a toll road for toll collection.

20. A mobile object identification device as claimed in claim 1, wherein said antenna control unit transmits said pilot signal and said unmodulated carrier-radio-wave successively.

21. A mobile object identification device for exchanging information between a mobile object and a station comprising:

an antenna control unit having an antenna disposed at said station for repeatedly transmitting a communication signal-wave, which includes a pilot signal and an interrogatory signal in a portion of a cycle time of said communication signal-wave, and an unmodulated carrier-radio-wave through said antenna toward a first communication area, and for receiving a responding signal-wave from a second communication area in another portion of said cycle time; and a responder unit mounted on said mobile object for transmitting said responding signal-wave when receiving said pilot signal and said unmodulated carrier-radio-wave subsequently, said responder unit including:

a receiving circuit receiving said unmodulated carrier-radio-wave from said first communication area, a control circuit generating a responding data-signal, and a transmitting circuit modulating said unmodulated carrier-radio-wave with said responding data-signal and transmitting a modulated carrier-radio-wave as said responding signal-wave; wherein said antenna control unit comprises:

means for decreasing output power of said antenna to a prescribed level lower than said unmodulated carrier-radio-wave while said antenna control unit is transmitting said pilot signal of said communication signal-wave, said prescribed level being lower than the level of the output power of said antenna while said antenna control unit is transmitting said unmodulated carrier-radio-wave, to thereby decrease said first communication area so that the first communication area of said pilot signal coincides with the second communication area of said responding signal-wave, and means for switching said pilot signal to said interrogatory signal when an acknowledgment of said pilot signal is received by said antenna control unit.

22. A mobile object identification device claimed in claim 21, further comprising a gate for toll collection, wherein said antenna is disposed on said gate.

23. A mobile object identification device claimed in claim 22, wherein said antenna control unit comprises means for transmitting said unmodulated carrier-radio-wave subsequent to said interrogatory signal-wave.

24. A mobile object identification device claimed in claim 23, further comprising a signal-processing-circuit for processing data for said toll collection when receiving said responding signal-wave.

25. A mobile object identification device claimed in claim 22, wherein said antenna control unit further comprises a plurality of antennas disposed on said gate.

26. A mobile object identification device claimed in claim 25, wherein said antenna control unit further comprises means for generating a plurality of carrier-radio-waves having different frequencies, and respectively assigning said carrier-radio-waves to said plurality of antennas corresponding to said communication areas which overlap with one another.

27. A mobile object identification device claimed in claim 26, wherein said means for generating a plurality of carrier-radio-waves having different frequencies further comprises circuit means for supplying said communication signal-waves to said plurality of antennas at different times.

28. A mobile object identification device claimed in claim 24, wherein said responder unit includes a communication program which controls said responder unit to stop communication for a given period after said toll collection process has been completed.

29. A mobile object identification device claimed in claim 24, wherein said responder unit includes a communication program which controls said responder unit to stop communication until a given running distance after said toll collection process has been completed.

30. A mobile object identification device claimed in claim 22, wherein said antenna control unit comprises means for transmitting said pilot signal and an unmodulated carrier-radio-wave successively, and an interrogatory signal-wave after receiving said responding signal-wave from said responder unit.

31. A mobile object identification device claimed in claim 30, wherein said responder unit includes a communication program which controls said responder unit to stop communication until it has received said pilot signal-wave.

32. A mobile object identification device claimed in claim 31, wherein said responder unit includes a communication program which controls said responder unit to prohibit communication with other antennas when it has received a pilot signal-wave from one of said antennas.

33. A mobile object identification device claimed in claim 31, wherein said means for transmitting said pilot signal-wave and interrogatory signal wave transmit said pilot signal-wave at a power level lower than said interrogatory signal-wave.

34. A mobile object identification device claimed in claim 31, wherein said means for transmitting said unmodulated carrier-radio-wave transmits said unmodulated carrier-radio-wave at the same power level as said interrogatory signal-wave.

35. A mobile object identification device claimed in claim 21, wherein said pilot signal indicates that said mobile object has entered said communication area.

36. A mobile object identification device claimed in claim 21, wherein said unmodulated carrier-radio-wave is transmitted after said pilot signal.

37. A mobile object identification device claimed in claim 21, wherein said mobile object is mounted on an automobile, and said station is disposed at a toll road for toll collection.

38. A mobile object identification device as claimed in claim 21, wherein said antenna control unit transmits said pilot signal and said unmodulated carrier-radio-wave successively.

39. A mobile object identification device where information is exchanged between a mobile object and a station comprising:

an antenna control unit having an antenna disposed at said station for repeatedly transmitting a communication signal-wave which includes a pilot signal and an interrogative signal in a portion of a cycle time of said communication signal-wave through said antenna toward a first communication area and receiving a responding signal-wave from a second communication area in another portion of said cycle time; and a responder unit mounted on said mobile object for transmitting said responding signal-wave when receiving said communication signal-wave, said responder unit including a circuit for transmitting said responding data-signal as said responding signal-wave; wherein said antenna control unit comprises:

means for decreasing output power of said antenna to a prescribed level while said antenna control unit is transmitting said pilot signal of said communication signal-wave, said prescribed level being lower than the level of the output power of said antenna while said antenna control unit is transmitting said interrogative signal, to thereby decrease the first communication area, and means for switching said pilot signal to said interrogative signal when an acknowledgment of said pilot signal is received by said antenna control unit.

40. A mobile object identification device claimed in claim 39, wherein said means for decreasing output power of said antenna decreases said output power so that said first communication area of said pilot signal coincides with said second communication area of said responding signal-wave.

41. A mobile object identification device claimed in claim 39, wherein said antenna control unit further comprises a plurality of antennas disposed on a gate.

42. A mobile object identification device claimed in claim 41, wherein said antenna control unit further comprises means for generating a plurality of carrier-radio-waves having different frequencies, and respectively assigning said carrier-radio-waves to said plurality of antennas corresponding to said communication areas which overlap with one another.

43. A mobile object identification device claimed in claim 42, wherein said means for generating said carrier-radio-waves having different frequencies further comprises circuit means for supplying said communication signal-waves to said plurality of antennas at different times.

44. A mobile object identification device claimed in claim 39, wherein said pilot signal indicates that said mobile object has entered said communication area.

45. A mobile object identification device claimed in claim 39, wherein an unmodulated carrier-radio-wave is transmitted by said antenna control unit after said pilot signal is transmitted by said antenna control unit.

46. A mobile object identification device claimed in claim 39, wherein said interrogative signal causes said responder unit to read data stored therein and transmit said stored data.

47. A mobile object identification device claimed in claim 39, wherein said mobile object is mounted on an automobile, and said station is disposed at a toll road for toll collection.

48. A mobile object identification device as claimed in claim 39, wherein said antenna control unit transmits said pilot signal and an unmodulated carrier-radio-wave successively.

* * * * *